United States Patent
Jang

(10) Patent No.: US 7,838,421 B2
(45) Date of Patent: Nov. 23, 2010

(54) METHOD OF FORMING METAL LINE OF SEMICONDUCTOR DEVICE

(75) Inventor: Min Sik Jang, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 123 days.

(21) Appl. No.: 12/163,374

(22) Filed: Jun. 27, 2008

(65) Prior Publication Data

US 2009/0130844 A1    May 21, 2009

(30) Foreign Application Priority Data

Nov. 20, 2007    (KR) .................... 10-2007-0118594

(51) Int. Cl.
*H01L 21/44* (2006.01)

(52) U.S. Cl. .................... 438/672; 438/629; 438/584; 438/597; 438/618; 257/98; 257/773; 257/774; 257/E21.627; 257/E21.641

(58) Field of Classification Search .................... 438/629, 438/672, 673, 584, 597, 618, 622, 625, 674, 438/675; 257/98, 195, 343, 758, 773, 774, 257/E21.627, E61.641, E21.649, E21.658
See application file for complete search history.

(56) References Cited

U.S. PATENT DOCUMENTS

| 7,291,556 | B2 * | 11/2007 | Choi et al. | 438/672 |
| 2004/0127022 | A1 * | 7/2004 | Juengling | 438/652 |
| 2005/0250307 | A1 * | 11/2005 | Park et al. | 438/618 |
| 2006/0197230 | A1 * | 9/2006 | Anezaki et al. | 257/774 |
| 2006/0237851 | A1 * | 10/2006 | Ko et al. | 257/774 |
| 2006/0290659 | A1 * | 12/2006 | Sakano et al. | 345/156 |

FOREIGN PATENT DOCUMENTS

| KR | 10-2005-0123454 | 12/2005 |
| KR | 10-2007-0000598 | 1/2007 |

* cited by examiner

*Primary Examiner*—Matthew S Smith
*Assistant Examiner*—Su C Kim
(74) *Attorney, Agent, or Firm*—Marshall, Gerstein & Borun LLP

(57) ABSTRACT

A method of forming metal lines of a semiconductor device, comprising providing a semiconductor substrate in which a plurality of gates and junctions formed between the gates are included in a cell area and a peripheral area; forming an insulating layer over the semiconductor substrate including the gates; forming an etch protection layer over the insulating layer; etching the etch protection layer and the insulating layer, and gap-filling conductive material to form contact plugs contacting the junctions of the cell area; and, forming first metal lines contacting the contact plugs and forming second metal lines contacting the junctions of the peripheral area by etching the etch protection layer and the insulating layer.

11 Claims, 8 Drawing Sheets

METHOD OF FORMING METAL LINE OF SEMICONDUCTOR DEVICE

CROSS-REFERENCE TO RELATED APPLICATION

Priority to Korean patent application number 10-2007-0118594, filed on Nov. 20, 2007, the disclosure of which is incorporated by reference in its entirety, is claimed.

BACKGROUND OF THE INVENTION

The invention relates generally to a method of forming metal lines of a semiconductor device and, more particularly, to a method of forming metal lines of a flash memory device.

Generally, semiconductor memory devices can be classified into volatile memory devices and non-volatile memory devices. Volatile memory devices, such as Dynamic Random Access Memory (DRAM) and Static Random Access Memory (SRAM), have fast data input/output, but lose their data when power is off. Meanwhile, non-volatile memory devices retain their data even when power is off.

A flash memory device is a kind of a non-volatile memory device, and is a highly-integrated memory device, which was developed by combining the advantages of Erasable Programmable Read Only Memory (EPROM) that can be programmed and erased, and Electrically Erasable Programmable Read Only Memory (EEPROM), that can be electrically programmed and erased. Here, the terminology 'program' refers to an operation of writing data into a memory cell, and 'erase' refers to an operation of deleting data written into a memory cell.

Flash memory devices can be divided into NOR type and NAND type flash memory devices according to the structure and operating condition of a cell. In the NOR type flash memory device, the drain of each memory cell transistor is coupled to a bit line, enabling program and erase operations with respect to a specific address, therefore increasing the operating speed. The NOR type flash memory device is generally used in applications requiring high-speed operation. In contrast, in the NAND type flash memory device, a plurality of memory cell transistors are connected in series, constituting one string, and one string is coupled between bit lines and a common source line. Thus, the NAND type flash memory device has a relatively small number of drain contact plugs, facilitating a high degree of integration. Accordingly, the NAND type flash memory device is generally used in applications requiring high-capacity data retention.

This NAND type flash memory device comprises a plurality of word lines formed between a source select line and a drain select line. A select line, for example, the source select line or the drain select line is formed by connecting gates of select transistors, each included in a plurality of strings. The word lines are formed by connecting gates of memory cell transistors. The select line and the word line each generally include a tunnel oxide layer, a floating gate, a dielectric layer, and a control gate. In the select line, the floating gate and the control gate are electrically connected. A junction is formed between each select line and each word line. Here, the junction between the source select lines is a source area, and the junction between the drain select lines is a drain area.

Meanwhile, an insulating layer is formed on the select line and the word lines. Metal lines, for example, bit lines are formed on the insulating layer. The metal lines are electrically connected to the junctions through contact plugs formed in the insulating layer. However, as semiconductor devices have gradually become miniaturized and highly integrated, the respective widths of the contact plug and the metal line have gradually narrowed. Accordingly, it has become increasingly important to form the contact plugs and the metal lines without defects.

BRIEF SUMMARY OF THE INVENTION

The invention is directed to a method of forming metal lines of a semiconductor device, in which an etch protection layer is formed on an insulating layer comprising oxide materials, by using materials having an etch selectivity different from that of the oxide materials, so that the height of the insulating layer can be prevented from becoming low due to etching in a process of removing a native oxide layer, which can be performed when metal lines are formed, or in a process of forming contact holes in the insulating layer.

According to the invention, a method of forming metal lines of a semiconductor device comprises: providing a semiconductor substrate comprising a cell area and a peripheral area, each of said cell area and said peripheral area comprising a plurality of gates and a plurality of junctions formed between the gates; forming an insulating layer over the semiconductor substrate including the gates; forming an etch protection layer over the insulating layer; etching the etch protection layer and the insulating layer to expose the junctions of the cell area, and gap-filling conductive material to form contact plugs contacting the junctions of the cell area; and, etching the etch protection layer and the insulating layer to expose the junctions of the peripheral area, and forming first metal lines contacting the contact plugs and forming second metal lines contacting the junctions of the peripheral area.

The etch protection layer is preferably formed using materials having an etch selectivity different from that of the insulating layer. The etch protection layer is preferably formed of a nitride layer. Formation of the contact plugs preferably comprises forming first contact holes through which the junctions of the cell area are exposed by etching the etch protection layer and the insulating layer, gap-filling the first contact holes with conductive material, thus forming contact plugs, and lowering a height of the contact plugs below a height of the first contact holes. A spacer is preferably formed on sidewalls of the first contact holes exposed upwardly from the contact plugs. The spacer is preferably formed of materials having etch selectivities different from that of the insulating layer. The spacer is preferably formed of a nitride layer. A cleaning process is preferably performed after the spacer is formed. Formation of the second metal lines preferably comprises forming second contact holes through which the junctions of the peripheral ("peri") area are exposed by etching the etch protection layer and the insulating layer, performing an ion implantation process on the junctions of the peri area through the second contact holes, forming a metal barrier layer in the second contact holes, and forming a metal material on the metal barrier layer of the second contact holes. The first metal lines and the second metal lines are preferably formed at the same time. After the second contact holes are formed, a cleaning process is preferably performed. The ion implantation process is preferably performed so as to selectively open only desired junctions using a mask. After the mask can be removed, a cleaning process is preferably performed. Before the metal barrier layer is formed, a cleaning process for removing a native oxide layer is preferably performed.

DESCRIPTION OF SPECIFIC EMBODIMENT

A specific embodiment according to the invention is described below with reference to the accompanying drawings. However, the invention is not limited to the disclosed embodiment, but may be implemented in various ways. The embodiment is provided to complete the disclosure of the invention and to allow those having ordinary skill in the art to understand the scope of the invention. The scope of the invention is defined only by the claims.

FIGS. 1A to 1H are cross-sectional views illustrating a method of forming metal lines of a semiconductor device in accordance with the invention.

Figure 1A:
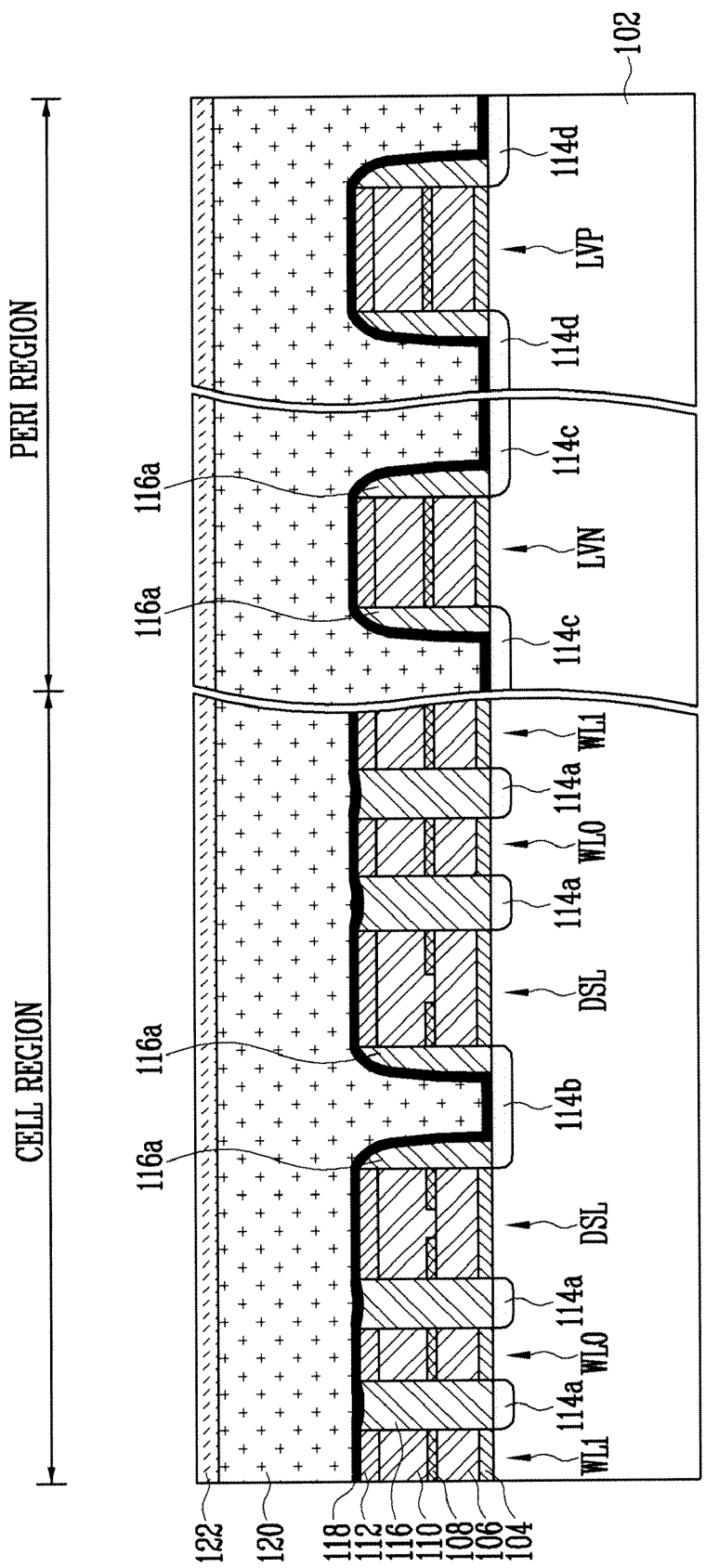
FIGS. 1A to 1H are cross-sectional views illustrating a method of forming metal lines of a semiconductor device in accordance with the invention.

Referring to FIG. 1A, in order to form a semiconductor device, in particular, a flash memory device, a screen oxide layer (not shown) is first formed on a semiconductor substrate 102. The screen oxide layer functions to prevent a surface of the semiconductor substrate 102 from being damaged when a well ion implantation process or a threshold voltage ion implantation process is subsequently performed. The well ion implantation process is performed so as to form well areas in the semiconductor substrate 102, and the threshold voltage ion implantation process is performed so as to control the threshold voltages of semiconductor elements such as transistors. The well areas (not shown) are formed in the semiconductor substrate 102, and the well areas can have a triple structure.

After the screen oxide layer (not shown) is removed, isolation areas (not shown) and active areas are defined by an isolation layer formation process, etc. Stacked layers are formed on the semiconductor substrate 102. Each stacked layer includes a tunnel insulating layer 104, a first conductive layer 106 for a floating gate, a dielectric layer 108, a second conductive layer 110 for a control gate, and a gate electrode layer 112. The first conductive layer 106 and the second conductive layer 110 are preferably formed from polysilicon, and the dielectric layer 108 preferably has an oxide/nitride/oxide (ONO) structure. The dielectric layer 108 in which select transistors are formed is partially etched, so the first conductive layer 106 and the second conductive layer 110 can be electrically connected. The gate electrode layer 112 is preferably formed from tungsten silicide (WSix).

The stacked layers are patterned, preferably using an etch process employing a gate mask pattern (not shown) formed on the gate electrode layer 112. Accordingly, word lines WL0, WL1, . . . in which a plurality of memory cell gates are connected in series are formed in a cell area of the semiconductor substrate 102. Here, each of the memory cell gates has the stacked layer of the tunnel insulating layer 104, the first conductive layer 106 for the floating gate, the dielectric layer 108, the second conductive layer 110 for the control gate, and the gate electrode layer 112. Typically, the number of the word lines WL0, WL1, . . . is 16 or 32. However, only every two word lines are illustrated, for the sake of convenience. A drain select line (DSL) and source select line (SSL, not shown, for the sake of convenience) to which a number of select gates are connected in series is formed across the word lines WL0, WL1, . . . . Here, each of the select gates has a stacked layer of the tunnel insulating layer 104, the first conductive layer 106, and the second conductive layer 110 electrically connected to each other, and the gate electrode layer 112.

A low voltage NMOS (LVN) or a low voltage PMOS (LVP), that is, one of a number of peripheral ("peri") gates, for example, NMOS devices, is formed in the peri area of the semiconductor substrate 102.

A plurality of junctions 114a, 114d are formed by performing an ion implantation process on the semiconductor substrate 102 exposed between the word lines WL0, WL1, . . . , the select line DSL or SSL, and the peri gate. In particular, a junction 114c of the low voltage NMOS (LVN) is formed by implanting N type impurities, and a junction 114d of the low voltage PMOS (LVP) is formed by implanting P type impurities. Moreover, the junction 114b formed between the drain select lines DSL becomes a drain area.

Next, a first insulating layer 116 is formed over the semiconductor substrate 102, including the word lines WL0, WL1, . . . , the select line DSL or SSL, and the peri gates. An anisotropic etch process or other suitable process is performed on the first insulating layer 116, thus forming a spacer 116a on sidewalls of the peri gates and the select line DSL or SSL. The spacer 116a functions to protect the sidewalls. At this time, the first insulating layer 116 remains between the respective word lines WL0, WL1, . . . and between the select line DSL or SSL and the word lines WL0, WL1, . . . since a gap between the respective word lines and between the select line and the word lines is narrow.

A first passivation layer 118 is formed over the entire surface of the semiconductor substrate 102, including the first insulating layer 116. The first passivation layer 118 functions to protect the sidewalls of the select line DSL or SSL and the peri gates. The first passivation layer 118 is formed for the purpose of a Self-Aligned Contact (SAC) process for preventing the sidewalls of the select line DSL or SSL and the peri transistors from being etched and damaged should an alignment error occur when contact holes are formed on the junctions 114b to 114d in a subsequent process. The first passivation layer 118 can be formed from a material (for example, a nitride layer) having an etch selectivity that is different from that of an oxide layer of the insulating layers. The first passivation layer 118 can be formed in a thickness sufficiently thin to maintain the step of the stacked layer formed by the process described above.

A second insulating layer 120 is formed on the first passivation layer 118. Since the metal lines are formed on the second insulating layer 120, the second insulating layer 120 can be formed to have a height higher than that of the word lines WL0, WL1, . . . , the select line DSL or SSL, and the peri gates such that a sufficient step can be provided between the semiconductor substrate 102 and the metal lines. The second insulating layer 120 is preferably an oxide layer, for example, any one of a High-Density Plasma (HDP) oxide layer, a Spin On Glass (SOG) oxide layer, and a low-k oxide layer, for example.

A second passivation layer 122 is formed on the second insulating layer 120. The second passivation layer 122 functions to prevent the second insulating layer 120 from being etched in a subsequent etch process performed on the second insulating layer 120. The second passivation layer 122 is preferably formed using a material with an etch selectivity different from that of the second insulating layer 120 of the insulating layers, for example, a nitride layer. The nitride layer is preferably formed by a Low Pressure Chemical Vapor Deposition (LPCVD) method, an Atomic Layer Deposition (ALD) method, a Plasma-Enhanced Chemical Vapor Deposition (PECVD) method, or the like.

Figure 1B:
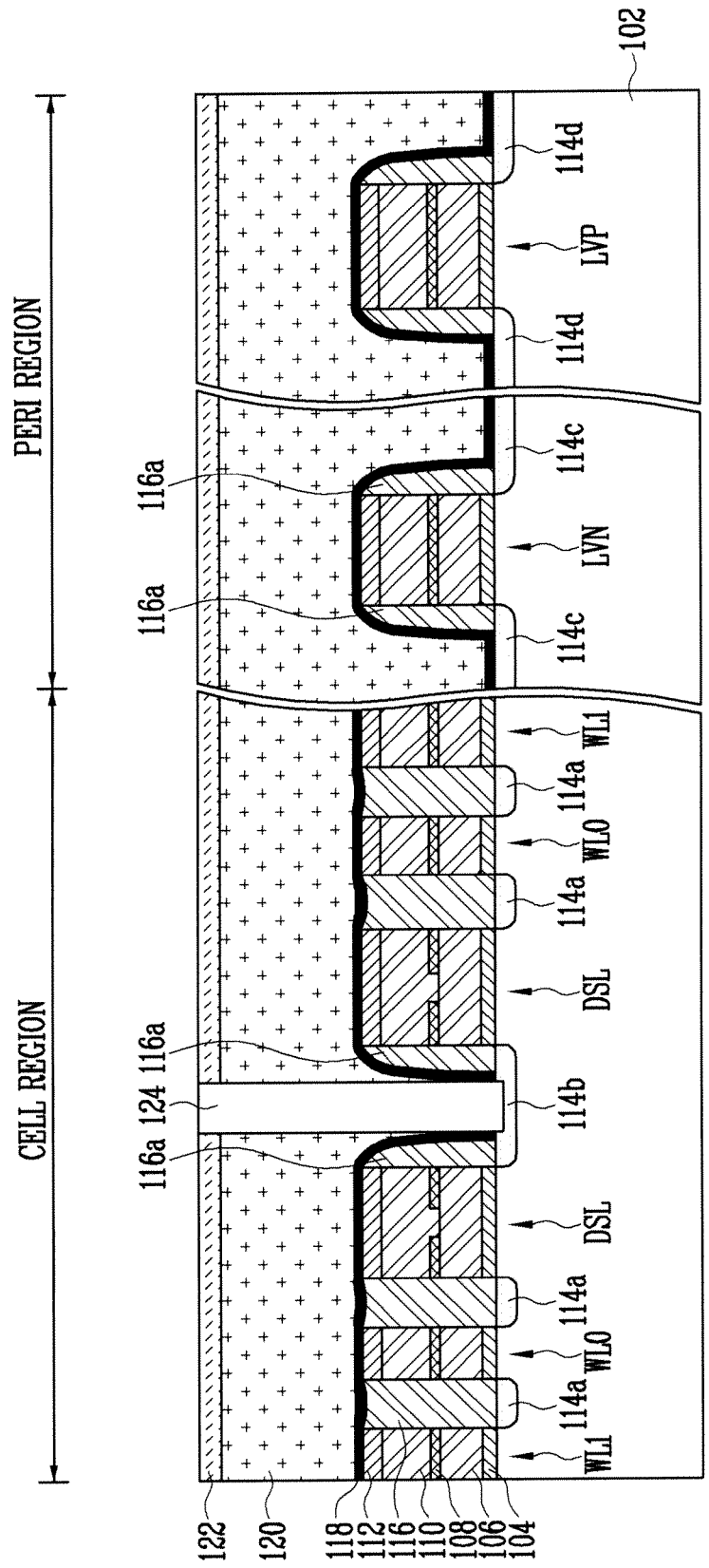

Referring to FIG. 1B, the second passivation layer 122 and the second insulating layer 120 are etched, thus forming a drain contact hole through which the junction 114b, that is, the drain area formed between the drain select lines DSL, is exposed. The drain contact hole is gap-filled with conductive material, for example, polysilicon having an excellent gap-fill characteristic. The conductive material formed on the second passivation layer 122 is removed, preferably by a Chemical Mechanical Polishing (CMP) method, but the conductive material remains only on the drain contact hole, thereby forming a drain contact plug 124 electrically connected to the junction 114b, that is, the drain area.

Figure 1C:
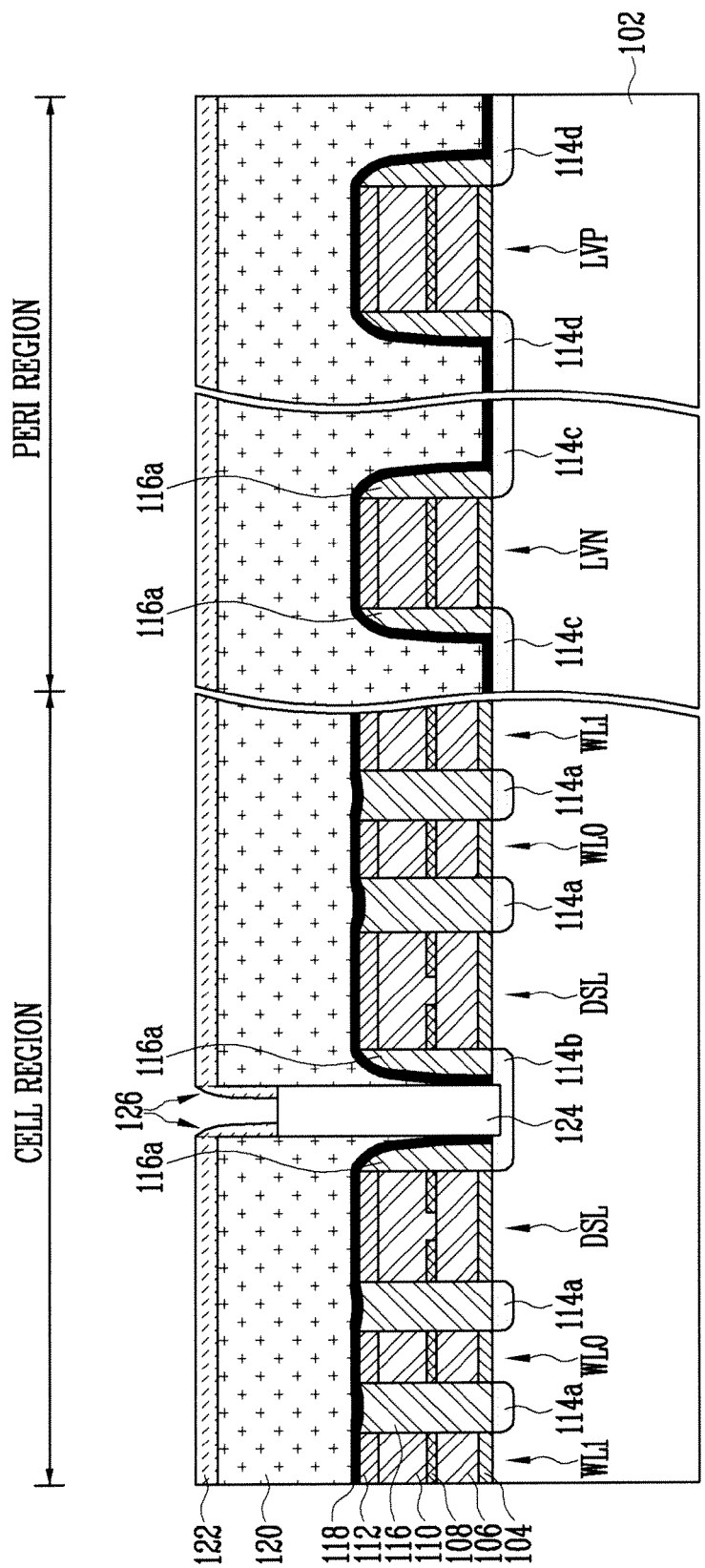

Referring to FIG. 1C, an etchback process is performed on a top surface of the drain contact plug 124 so as to lower the height of the drain contact plug 124. A spacer material layer is formed on the second passivation layer 122, including the contact hole on the drain contact plug 124. The spacer material layer is formed using a material having an etch selectivity different from that of the second insulating layer 120, for example, a nitride layer. An anisotropic etch process or other suitable process is performed on the spacer material layer such that the spacer material layer remains only on the sidewalls of the contact hole on the drain contact plug 124 so as to form a spacer 126. The spacer 126 may serve as a barrier for preventing the drain contact hole from being damaged in a subsequent cleaning process.

Thereafter, in order to remove byproducts occurred by the anisotropic etch process, a cleaning process is carried out. This cleaning process is performed using an etchant, which can etch an oxide layer, but does not etch the second insulating layer 120 since the second insulating layer 120 is not exposed due to the second passivation layer 122 and the spacer 126. Suitable etchants include HF solutions and Buffered Oxide Etchant (BOE), for example.

Figure 1D:
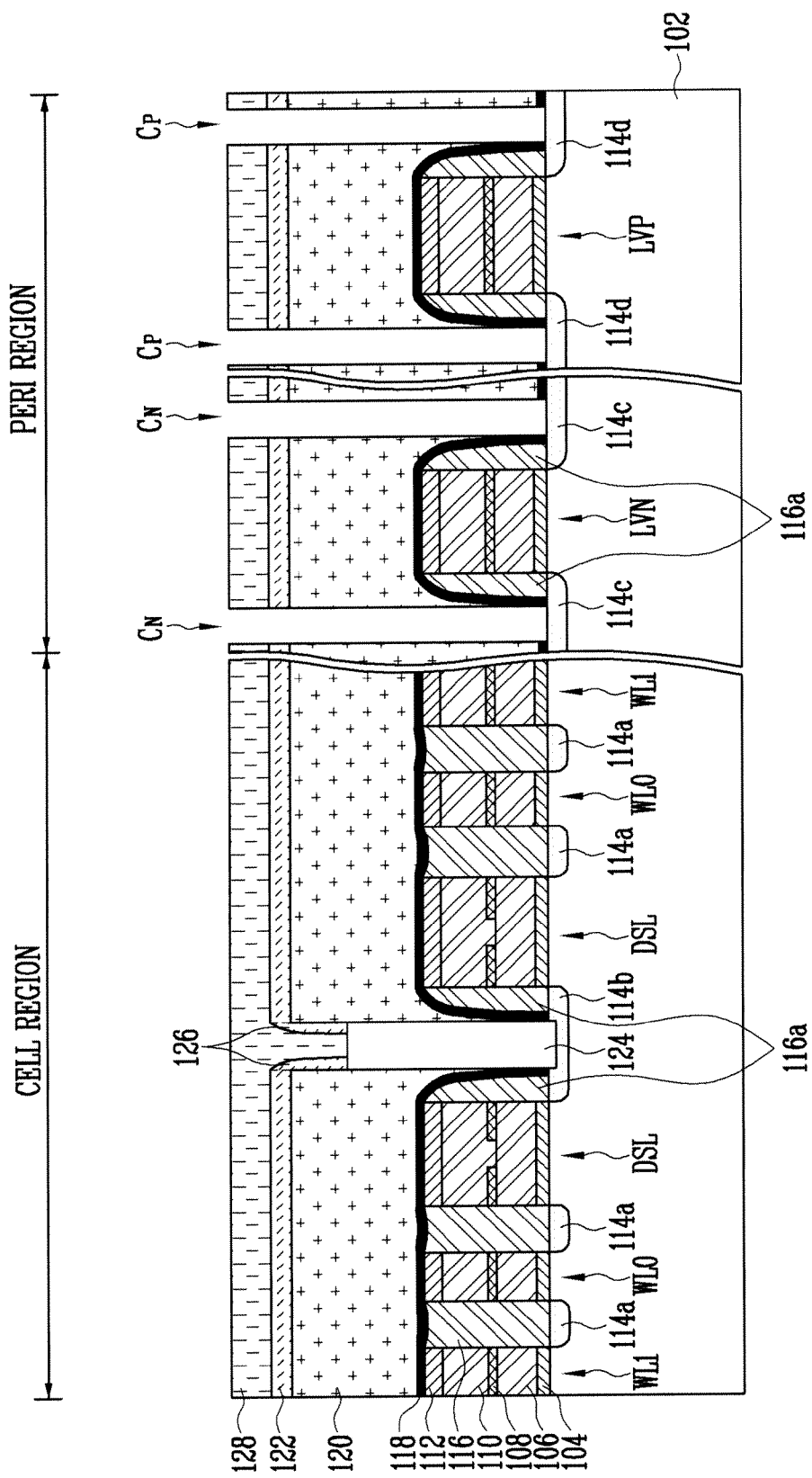

Referring to FIG. 1D, a mask pattern 128 is formed on the second passivation layer 122. The mask pattern 128 is formed in such a way as to open the junctions 114c formed on both sides of the low voltage NMOS (LVN) of the peri area and the junctions 114d formed on both sides of the low voltage PMOS (LVP). The mask pattern 128 is formed using a photoresist pattern (not shown). Contact holes $C_N$ through which the junctions 114c, formed on both sides of the low voltage NMOS (LVN), are opened and contact holes $C_P$ through which the junctions 114d, formed on both sides of the low voltage PMOS (LVP), are opened are formed by etching the second passivation layer 122 and the second insulating layer 120 using the mask pattern 128. Next, the photoresist pattern (not shown) and the mask pattern 128 are removed, and a cleaning process is then carried out. The cleaning process is performed using an etchant, which can etch an oxide layer, but the second insulating layer 120 is not etched since the second insulating layer 120 is not exposed due to the second passivation layer 122 and the spacer 126. Suitable etchants include HF solutions and Buffered Oxide Etchant (BOE), for example.

Figure 1E:
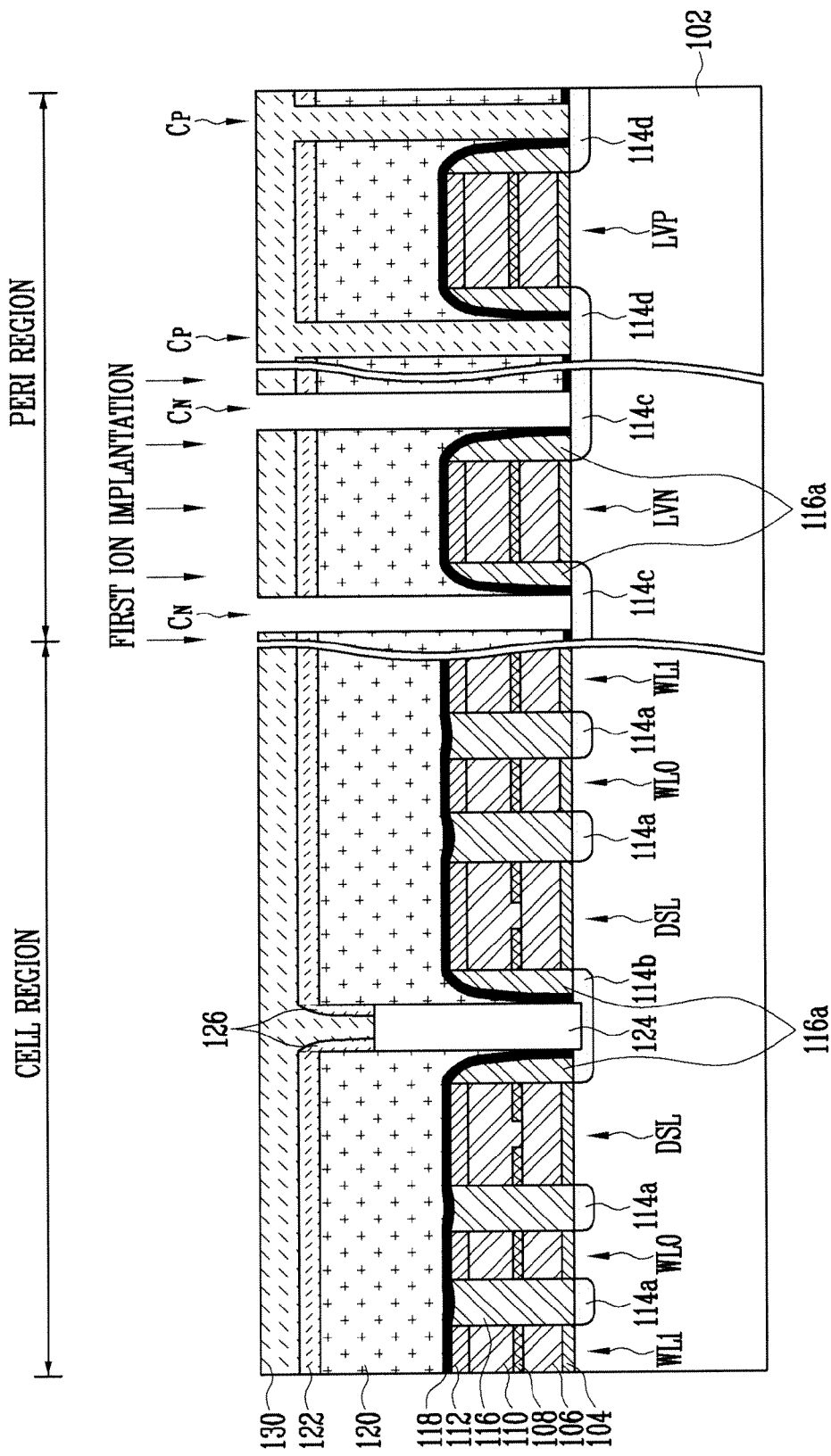

Referring to FIG. 1E, a first ion implantation mask 130, which opens only the contact holes $C_N$ through which the junctions 114c formed on both sides of the low voltage NMOS (LVN) are opened, is formed. The first ion implantation mask 130 can be formed using photoresist. A plug ion implantation process employing N type impurities is performed on the junctions 114c through the contact holes $C_N$. The plug ion implantation process is carried out so as to lower contact resistance of the junctions 114c. Next, the first ion implantation mask 130 is removed and a cleaning process is carried out. The cleaning process is performed using an etchant, which can etch an oxide layer, but the second insulating layer 120 is not etched since the second insulating layer 120 is not exposed due to the second passivation layer 122 and the spacer 126. Suitable etchants include HF solutions and Buffered Oxide Etchant (BOE), for example.

Figure 1F:
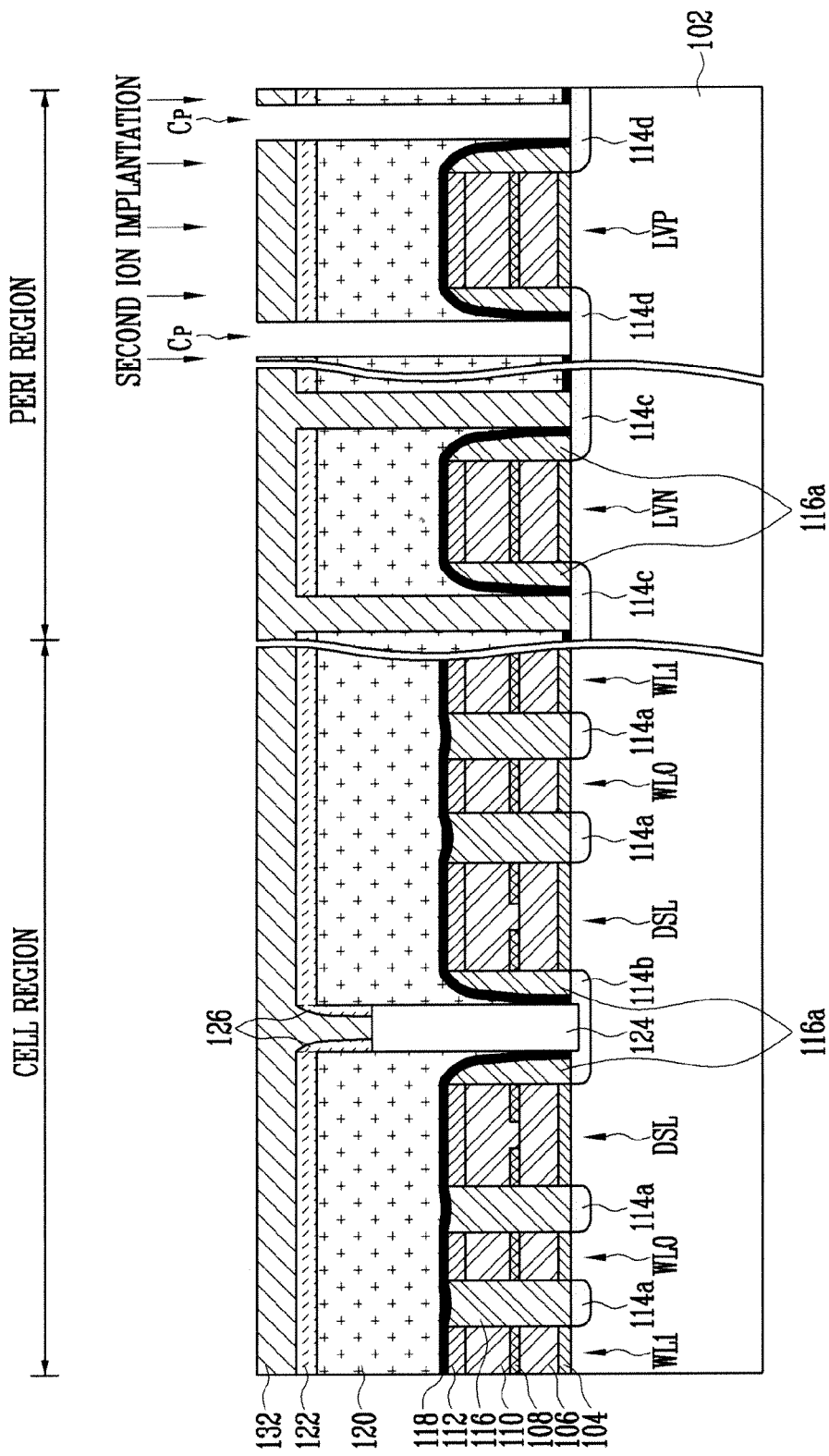

Referring to FIG. 1F, a second ion implantation mask 132, which opens only the contact holes $C_P$ through which the junctions 114d formed on both sides of the low voltage PMOS (LVP) are opened, is formed. The second ion implantation mask 132 can be formed using photoresist. A plug ion implantation process employing P type impurities is performed on the junctions 114d through the contact holes $C_P$. The plug ion implantation process is carried out so as to lower contact resistance of the junctions 114d. Next, the second ion implantation mask 132 is removed and a cleaning process is carried out. The cleaning process is performed using an etchant, which can etch an oxide layer, but the second insulating layer 120 is not etched since the second insulating layer 120 is not exposed due to the second passivation layer 122 and the spacer 126. Suitable etchants include HF solutions and Buffered Oxide Etchant (BOE), for example.

Figure 1G:
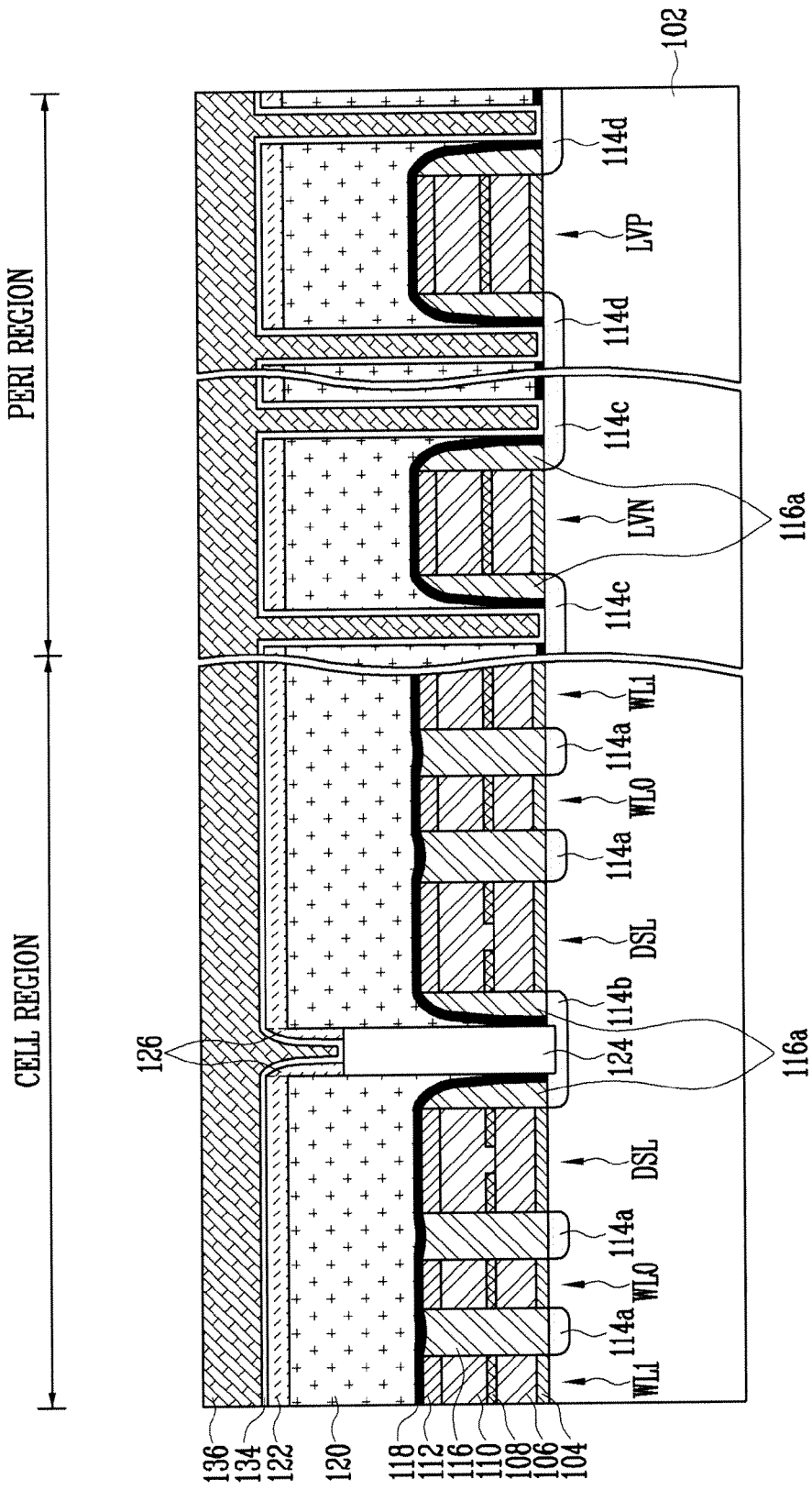

Referring to FIG. 1G, a cleaning process is performed so as to remove a native oxide layer formed on surfaces of the drain contact plug 124 for forming a metal line and the junctions 114c, 114d. The cleaning process is performed using an etchant, which can etch an oxide layer, but the second insulating layer 120 is not etched since the second insulating layer 120 is not exposed due to the second passivation layer 122 and the spacer 126. Suitable etchants include HF solutions and Buffered Oxide Etchant (BOE), for example.

Thereafter, a metal barrier layer 134 is formed on the second passivation layer 122, including the drain contact plug 124 and the junctions 114c, 114d. The metal barrier layer 134 functions to prevent a metal layer, formed on an upper side, from diffusing into a lower side and reduce resistance. The metal barrier layer 134 is preferably formed from Ti/TiN. Next, a metal material layer 136 is formed on the metal barrier layer 134 using metal material such as tungsten (W), thus gap-filling the contact holes such that they come in contact with the drain contact plug 124 and the junctions 114c, 114d.

Figure 1H:
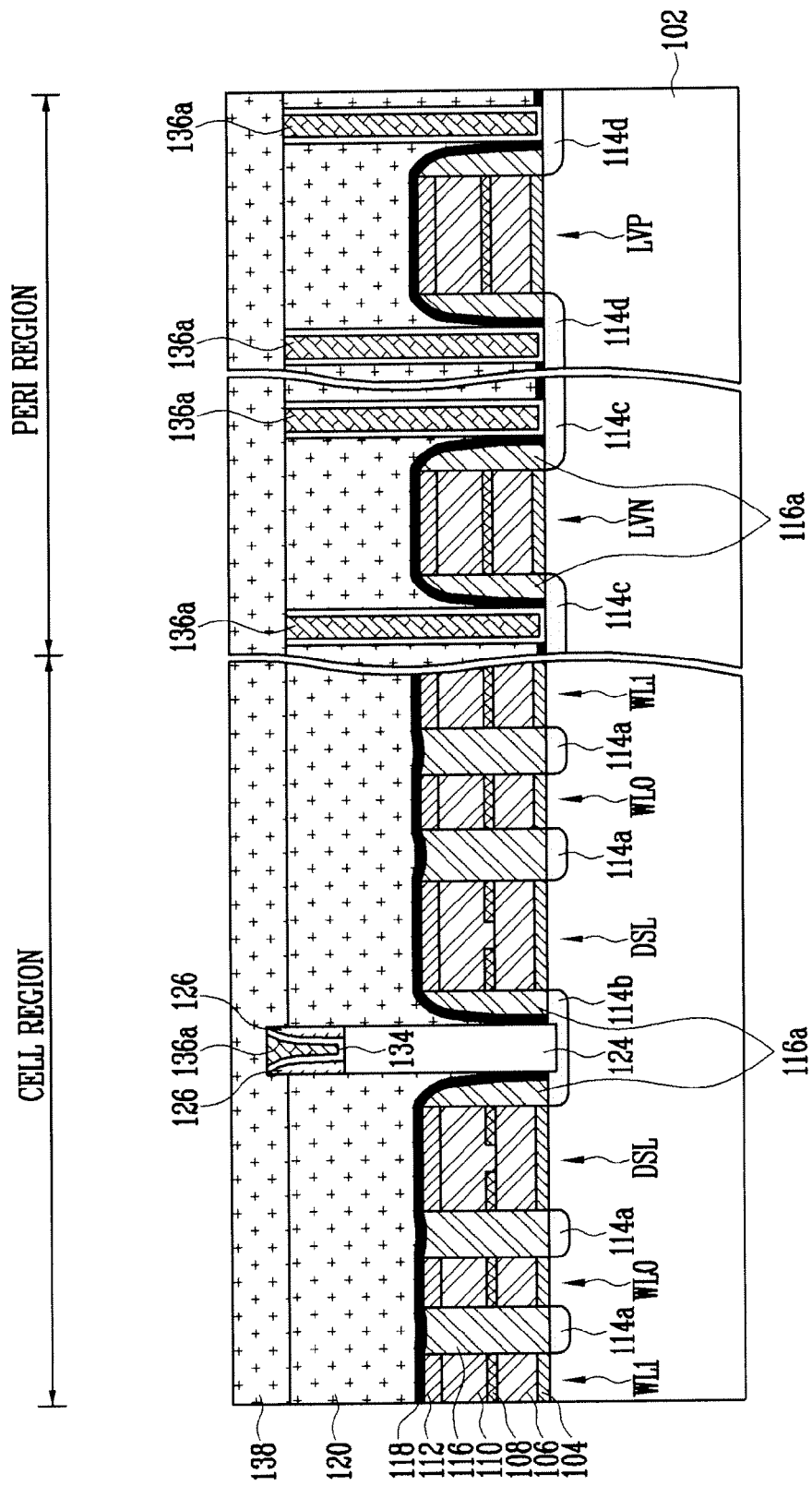

Referring to FIG. 1H, the second passivation layer (refer to 122 of FIG. 1G), and the metal barrier layer 134 and the metal material formed over the second passivation layer (refer to 122 of FIG. 1G) are removed, thereby forming metal lines 136a. The second passivation layer (refer to 122 of FIG. 1G) is preferably formed using the nitride layer, having a dielectric constant being twice higher than that of an oxide layer. This is because, if the second passivation layer (refer to 122 of FIG. 1G) remains, there may be a problem that interference charges are increased. The second passivation layer 122 (refer to 122 of FIG. 1G) is preferably removed using a dry etch process through an etchback process. Next, a third insulating layer 138 is formed on the second insulating layer 120, thus providing a step for forming other lines on the metal lines 136a.

According to the method of forming metal lines of a semiconductor device in accordance with the invention, the height of an insulating layer is not lowered, but can be maintained to its original height due to the second passivation layer in a process of forming metal lines. Accordingly, the spacer formed on the drain contact plug is not exposed upwardly from the second insulating layer during a cleaning process because the height of the second insulating layer is lowered. Accordingly, in a process of forming a subsequent metal barrier layer or metal lines, problems, which may be caused since the metal barrier layer remains on the sidewalls of the spacer, can be prevented.

The embodiment disclosed herein has been proposed to allow a person skilled in the art to easily implement the invention, and the person skilled in the part may implement the invention in various ways. Therefore, the scope of the invention is not limited by or to the embodiment as described above, and is defined only by the appended claims and their equivalents.

What is claimed is:

1. A method of forming metal lines of a semiconductor device, the method comprising:
    providing a semiconductor substrate comprising a cell area and a peripheral area, each of said cell area and said peripheral area comprising a plurality of gates and a plurality of junctions formed between the gates;
    forming a first insulating layer over the semiconductor substrate including the gates;
    forming a second insulating layer over the first insulating layer;
    forming an etch protection layer over the second insulating layer;
    forming first contact holes including sidewalls by etching the etch protection layer and the second insulating layer to expose the junctions of the cell area;
    forming contact plugs contacting the junctions of the cell area to fill a portion of the first contact holes with conductive material;
    forming second contact holes by etching the etch protection layer and the second insulating layer to expose the junctions of the peripheral area;
    forming a spacer on sidewalls of a remaining portion of the first contact holes;
    forming first metal lines contacting the contact plugs;
    forming second metal lines contacting the junctions of the peripheral area;
    removing the etch protection layer; and
    forming a third insulating layer on the second insulating layer including the first and second metal lines,
    wherein cleaning processes are performed between forming the contact plugs and forming the first and second metal lines and the etch protection layer prevents etching of the second insulating layer from being etched during the cleaning processes.

2. The method of claim 1, wherein the etch protection layer comprises a material having an etch selectivity different from that of the second insulating layer.

3. The method of claim 1, wherein the etch protection layer comprises a nitride layer.

4. The method of claim 1, wherein forming the contact plugs comprises:
    filling the first contact holes with the conductive material; and
    lowering a height of the contact plugs below a height of the first contact holes.

5. The method of claim 1, wherein the spacer comprises a material having an etch selectivity different from that of the second insulating layer.

6. The method of claim 1, wherein the spacer comprises a nitride layer.

7. The method of claim 1, wherein forming the second metal lines comprises:
    performing an ion implantation process on the junctions of the peripheral area through the second contact holes;
    forming a metal barrier layer in the second contact holes; and
    forming a metal material on the metal barrier layer of the second contact holes.

8. The method of claim 7, comprising performing the ion implantation process using a mask so as to selectively open only desired junctions.

9. The method of claim 8, further comprising removing the mask and performing a cleaning process after removing the mask.

10. The method of claim 7, further comprising performing a cleaning process for removing a native oxide layer before forming the metal barrier layer.

11. The method of claim 1, comprising simultaneously forming the first metal lines and the second metal lines.

* * * * *